(12) United States Patent
Morimoto et al.

(10) Patent No.: US 8,366,864 B2
(45) Date of Patent: Feb. 5, 2013

(54) COMPONENT PRESS BONDING APPARATUS AND METHOD

(75) Inventors: Masahiro Morimoto, Yamanashi (JP); Nobuyuki Kakita, Yamanashi (JP); Akira Kabeshita, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/388,492

(22) PCT Filed: Aug. 5, 2010

(86) PCT No.: PCT/JP2010/004924
§ 371 (c)(1),
(2), (4) Date: Feb. 2, 2012

(87) PCT Pub. No.: WO2011/016237
PCT Pub. Date: Feb. 10, 2011

(65) Prior Publication Data
US 2012/0125536 A1   May 24, 2012

(30) Foreign Application Priority Data
Aug. 6, 2009 (JP) ................................. 2009-182994

(51) Int. Cl.
B32B 37/00 (2006.01)
B29C 65/00 (2006.01)
(52) U.S. Cl. .......... 156/297; 156/556; 156/580; 29/832; 29/740
(58) Field of Classification Search .................. 156/297, 156/299, 308.2, 556, 557, 580, 560, 562, 156/583.1; 29/832, 834, 836, 739, 740; 100/193, 100/194, 202, 208
See application file for complete search history.

(56) References Cited

U.S. PATENT DOCUMENTS 5,439,161 A * 8/1995 Kawatani et al. ........ 228/180.21
7,021,357 B2 * 4/2006 Katano et al. ................. 156/556
(Continued)

FOREIGN PATENT DOCUMENTS

| JP | 3-261917 | 11/1991 |
| JP | 5-341303 | 12/1993 |

(Continued)

OTHER PUBLICATIONS

International Search Report issued Aug. 31, 2010 in International (PCT) Application No. PCT/JP2010/004924.

(Continued)

*Primary Examiner* — John Goff
(74) *Attorney, Agent, or Firm* — Wenderoth, Lind & Ponack, L.L.P.

(57) ABSTRACT

Link mechanisms provided corresponding to press bonding heads each include a first link member having one end pivotably connected to an upper end of the press bonding head, a second link member having one end pivotably connected to the other end of the first link member and having the other end pivotably connected to a link bracket above the press bonding head, and a connection slide part connected to a connection part between the first and second link members, collectively drive the connection slide parts of the link mechanisms by a press bonding head driving unit in horizontal directions (Y axis directions) orthogonal to a direction (X axis direction) of side-by-side arrangement of the plurality of press bonding heads, open and close the first and second link members of the link mechanisms in the vertical directions thereby collectively moving the plurality of press bonding heads downward and upward.

4 Claims, 16 Drawing Sheets

U.S. PATENT DOCUMENTS 7,075,036 B2 * 7/2006 Ogimoto et al. .............. 219/243
2010/0243153 A1 9/2010 Onitsuka et al.

FOREIGN PATENT DOCUMENTS

| JP | 09162242 A * | 6/1997 |
|---|---|---|
| JP | 3249177 | 1/2002 |
| WO | 2009/072282 | 6/2009 |

OTHER PUBLICATIONS

International Preliminary Report on Patentability issued Feb. 16, 2012 in International (PCT) Application No. PCT/JP2010/004924, together with English translation thereof.

* cited by examiner

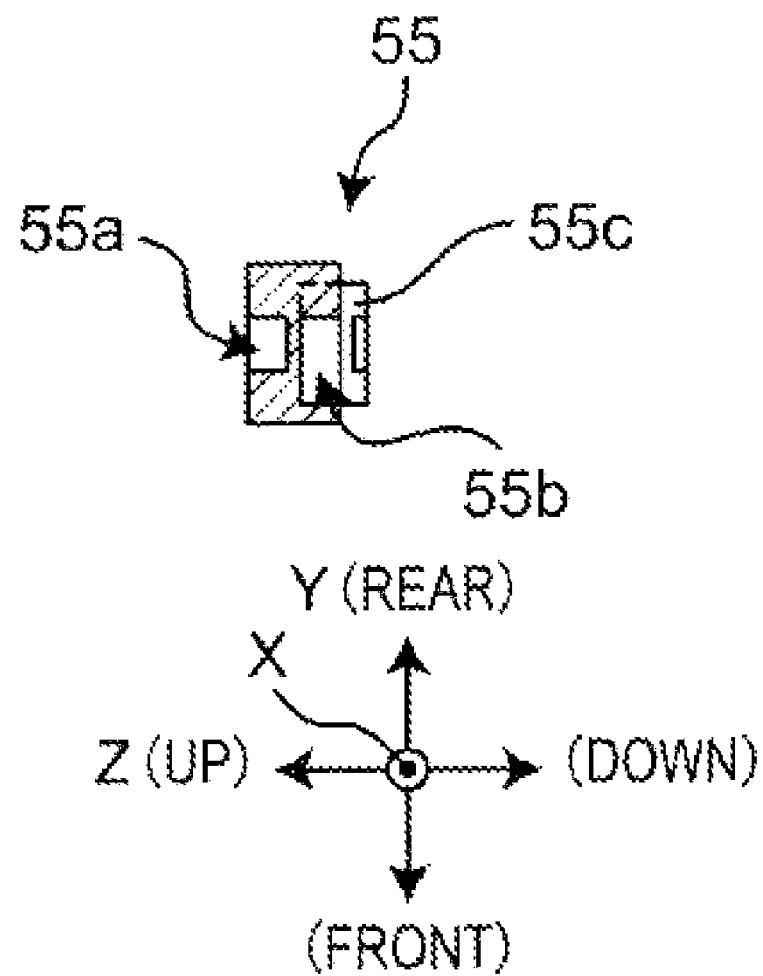

COMPONENT PRESS BONDING APPARATUS AND METHOD

TECHNICAL FIELD

The present invention relates to a component press boning apparatus and a component press bonding method for press bonding components onto a substrate such as liquid crystal panel, PDP (Plasma Display Panel), and organic EL (Electro-Luminescence) panel.

BACKGROUND ART

In processes of manufacturing modules of liquid crystal panels, for instance, a process is performed in which main press bonding is performed by press bonding heads for components such as driver IC, TCP (Tape Carrier Package), COF (Chip on Film), and FPC (Flexible Printed Circuit) that have been temporarily press bonded onto a substrate by Anisotropic Conductive Film (ACF, which will be referred to as conductive tapes), and a dedicated component press boning apparatus is used for such main press bonding for the components. In the component press bonding apparatus, the press bonding heads are moved up and down by pneumatic cylinders that are actuated in vertical directions, and are brought into contact with a substrate from above so as to press bond the components onto the substrate.

Among such component press bonding apparatuses, there has been known an apparatus in which a plurality of press bonding heads are made into a unit by being arranged side by side in order that a plurality of components can simultaneously be press bonded onto a substrate and in which the plurality of press bonding heads made into the unit are collectively moved up and down by one pneumatic cylinder that is actuated in vertical directions (PTL 1, for instance).

Patent Literature

PTL1: JP 3249177 B

SUMMARY OF INVENTION

Technical Problem

In the conventional component press bonding apparatus, however, overall reaction forces upon the contact of the press bonding heads with the substrate intensively act on press bonding head driving units (the one pneumatic cylinder in this example), thus it is necessary to use the press bonding head driving units with a large size that have great rigidity and great strength so as to withstand the reaction forces, and a problem is thereby caused in that the whole component press bonding apparatus is blocked from being made compact. The increase in the size of the press bonding head driving units causes another problem of a risk that difficulty in actuating the press bonding heads at high speed may result in decrease in productivity for the substrates.

Therefore, it is an object of the invention to provide a component press bonding apparatus and a component press bonding method by which compacting of the overall apparatus and improvement in productivity can be attained by reduction in size of the press bonding head driving units.

Solution to Problem

In order to achieve the object, the invention is configured as follows.

According to a first aspect of the present invention, there is provided a component press boning apparatus for press bonding components onto a substrate by bringing a plurality of press bonding heads from above into contact with side edge parts of the substrate having undergone positioning by a substrate positioning unit holding the substrate, the component press boning apparatus comprising:
  a frame which supports the plurality of press bonding heads so that the press bonding heads are movable upward and downward, the plurality of press bonding heads being arranged side by side,
  a plurality of link mechanisms which respectively move up and down the press bonding heads, the plurality of link mechanisms being provided corresponding to the press bonding heads, and
  a press bonding head driving unit which collectively actuates the link mechanisms thereby collectively moving the plurality of press bonding heads upward and downward, wherein
  the link mechanisms each comprising:
    a first link member having one end pivotably connected to an upper end of the press bonding head,
    a second link member having one end pivotably connected to the other end of the first link member and having the other end pivotably connected to the frame above the press bonding head, and
    a connection slide part connected to a connection part between the first link member and the second link member, wherein
  the press bonding head driving unit drives the connection slide parts of the link mechanisms in horizontal directions orthogonal to a direction of side-by-side arrangement of the plurality of press bonding heads, opens and closes the first link members and the second link members of the link mechanisms in vertical directions, thereby collectively moving the plurality of press bonding heads downward and upward.

According to a second aspect of the present invention, there is provided the component press bonding apparatus according to the first aspect, wherein the frame comprises:
  a first frame which supports the plurality of press bonding heads so that the press bonding heads are movable upward and downward, and
  a second frame configured separately from the first frame, the second frame supporting the press bonding head driving unit and pivotably supporting the other ends of the second link members.

According to a third aspect of the present invention, there is provided the component press bonding apparatus according to the first aspect, wherein the press bonding head driving unit comprises:
  a first slider which is reciprocated in the direction of the side-by-side arrangement of the plurality of press bonding heads, and
  a second slider connected to the connection slide parts of the link mechanisms, the second slider being driven by the first slider through a cam mechanism so as to move the connection slide parts of the link mechanisms in the directions orthogonal to the direction of the side-by-side arrangement of the plurality of press bonding heads.

According to a fourth aspect of the present invention, there is provided the component press bonding apparatus according to the third aspect, wherein the press bonding heads are supported by the frame so as to be independently movable in the directions of the side-by-side arrangement, wherein the link mechanisms are supported by the frame so as to be independently movable in the directions of the side-by-side arrangement of the press bonding heads, and the second slider comprises a connection groove which is formed in the direction of the side-by-side arrangement of the press bonding heads and to which the connection slide parts are connected so as to be movable in the direction of the side-by-side arrangement.

According to a fifth aspect of the present invention, there is provided the component press bonding apparatus according to the third aspect, wherein the cam mechanism of the press bonding head driving unit is a groove cam mechanism having a groove inclined with respect to the direction of the side-by-side arrangement of the plurality of press bonding heads.

According to a sixth aspect of the present invention, there is provided a component press boning method for press bonding components onto a substrate by bringing a plurality of press bonding heads, arranged side by side so as to be movable upward and downward and supported by a frame, into contact with side edge parts of the substrate from above, the component press boning method comprising:

driving connection slide parts in a horizontal direction orthogonal to a direction of side-by-side arrangement of the plurality of press bonding heads with respect to a plurality of link mechanisms that each have a first link member having one end pivotably connected to an upper end of the press bonding head, a second link member having one end pivotably connected to the other end of the first link member and having the other end pivotably supported by the frame above the press bonding head, and the connection slide part connected to a connection part between the first link member and the second link member and that are provided corresponding to the press bonding heads, moving the first link members and the second link members so that the first link members and the second link members are opened in a vertical direction, thereby collectively moving down the plurality of press bonding heads, press boning the plurality of components placed on the side edge parts of the substrate by the plurality of press bonding heads, and thereafter driving the connection slide parts in a direction opposite to the horizontal direction with respect to the plurality of link mechanisms, moving the first link members and the second link members so that the first link members and the second link members are closed in the vertical direction, thereby collectively moving up the plurality of press bonding heads.

Effect of Invention

In the invention, the plurality of press bonding heads arranged side by side in the frame are respectively moved up and down by the closing and opening actuation of the first link members and the second link members that form the link mechanisms. Thus most of reaction forces caused by the contact of the press bonding heads with the components on the side edge parts of the substrate can be exerted on the frame, so that the forces that act on the press bonding head driving unit can be decreased. Accordingly, a small-sized unit having low rigidity and low strength can be used as the press bonding head driving unit, so that the whole component press bonding apparatus can be made compact. The press bonding head driving unit for collectively actuating the plurality of press bonding heads can be decreased in size, and thus the press bonding heads can be actuated at high speed, so that productivity for the substrates can be improved. The connection slide parts have only to be driven in the horizontal directions in order to open and close the first link members and the second link members, and thus the press bonding head driving unit can be configured so as to drive the connection slide parts in the horizontal directions. Therefore, the press bonding head driving unit for collectively actuating the plurality of press bonding heads can be placed so as to extend in the horizontal direction in which comparatively large margins of space exist, that is, the direction of the side-by-side arrangement of the press bonding heads, and the whole component press bonding apparatus can be made compact from this aspect also.

BRIEF DESCRIPTION OF DRAWINGS

These aspects and features of the present invention will become clear from the following description taken in conjunction with the preferred embodiments thereof with reference to the accompanying drawings, in which:

FIG. 9C is a sectional view (sectional view of the Y axis slider taken along a line A-A in FIG. 9A) of the Y axis slider the press bonding head driving unit of the component press bonding apparatus in accordance with the embodiment of the invention includes;

DESCRIPTION OF EMBODIMENTS

Figure 1:
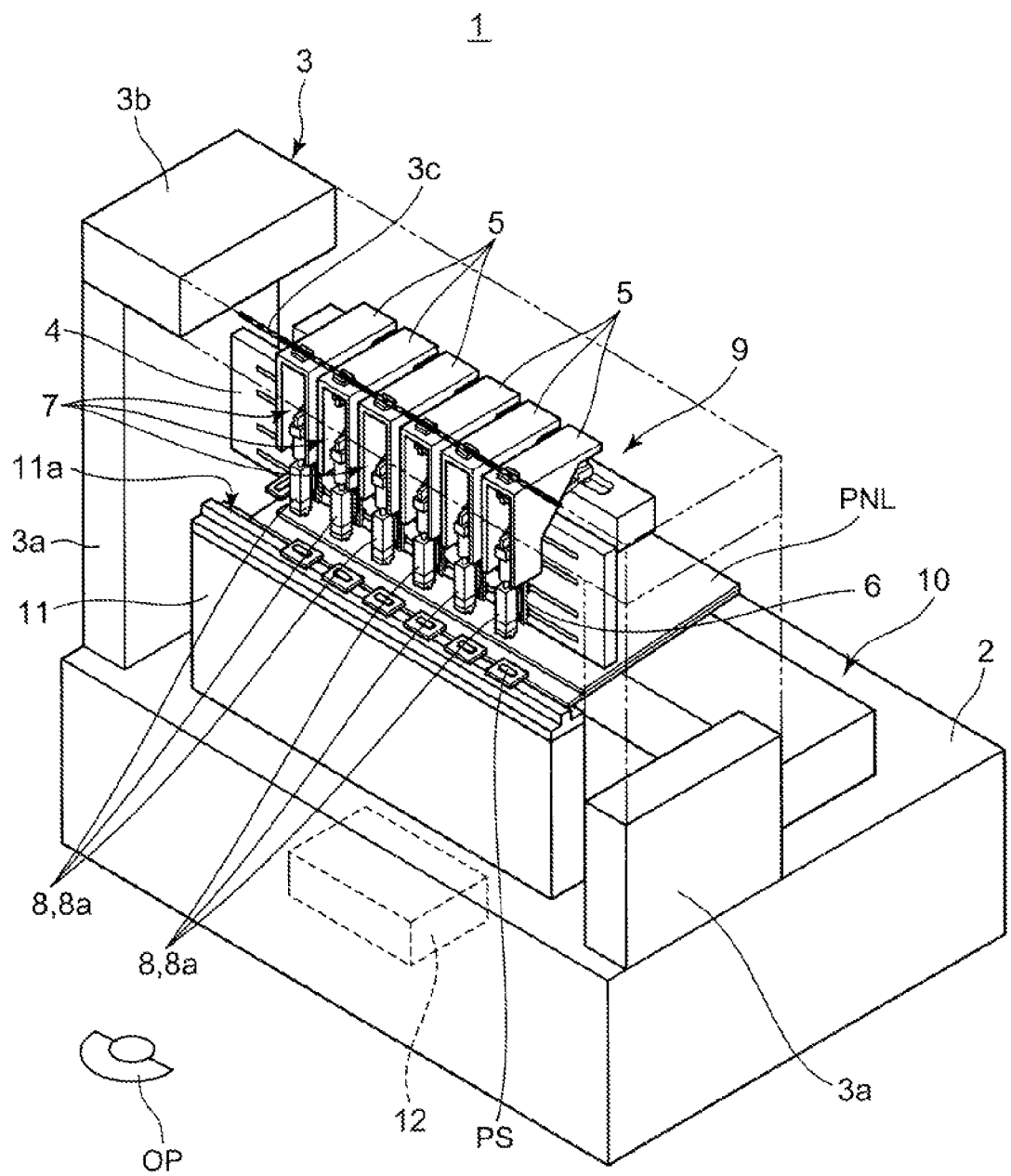
FIG. 1 is a perspective view of a component press bonding apparatus in accordance with an embodiment of the invention.
Figure 2:
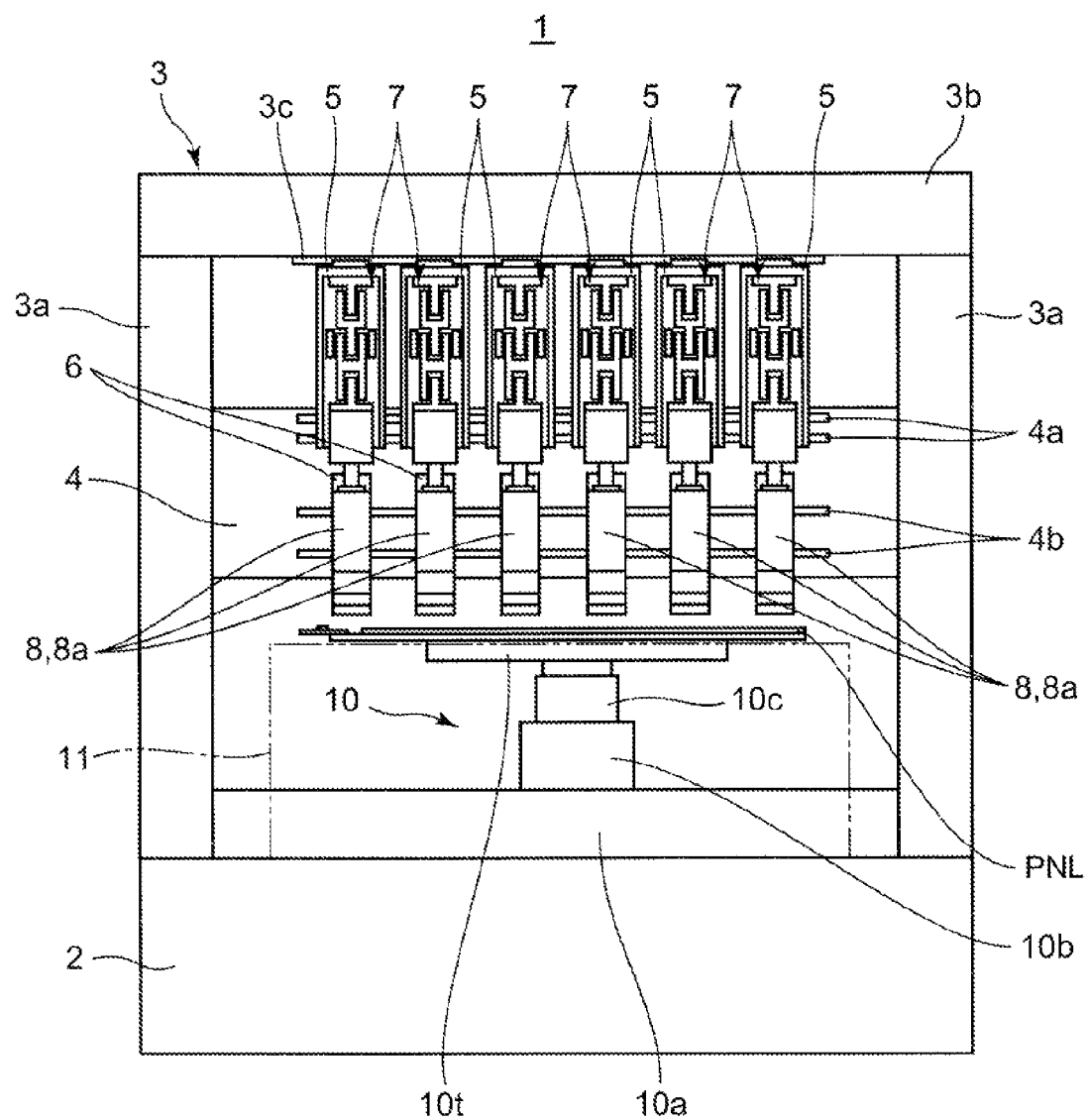
FIG. 2 is a front view of the component press bonding apparatus in accordance with the embodiment of the invention.
Figure 2:
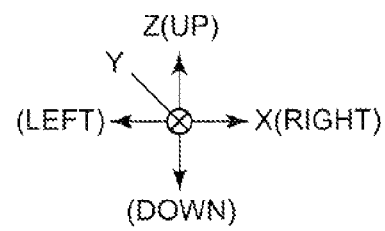

Before the description of the present invention proceeds, it is to be noted that like parts are designated by like reference numerals throughout the accompanying drawings. Embodiments of the present invention are hereinafter discussed in detail with reference to the drawings.

In FIGS. 1 through 4, a component press bonding apparatus (that will be referred to as press bonding apparatus hereinbelow) 1 in accordance with the embodiment has a base platform 2 and a gate-shaped frame 3 that is provided on the base platform 2 so as to extend in a transversal direction (that is defined as an X axis direction). The frame 3 is composed of a pair of vertical members 3a, 3a which are provided so as to extend upward from both end sides of the base platform 2 with respect to the X axis direction and a horizontal member 3b of which both ends are supported by both the vertical members 3a, 3a.

Herein, a side of an operator OP in the press bonding apparatus 1 with respect to a Y axis direction that is a position where the operator OP chiefly stands is defined as front face side (referred to as front face side hereinbelow), and a side opposed to the operator OP with respect to the Y axis direction is defined as rear side (back face side) (referred to as rear side or back face side hereinbelow).

A substrate PNL is held by a substrate positioning unit, and a plurality of press bonding heads 8 for press bonding components PS onto the substrate PNL by being brought into contact from above with the components PS on side edge parts of the substrate PNL having undergone positioning by the substrate positioning unit are supported by the frame 3 so as to be independently movable upward and downward. Specifically, a configuration (press bonding head support part) that supports the plurality of press bonding heads 8 so as to be capable of independently moving the heads upward and downward is composed of a beam member 4 supported by the frame 3, link brackets 5, auxiliary plates 6 and the like. Specifically, both ends of the beam member 4 that is provided so as to extend in the X axis direction are mounted on middle parts, with respect to a vertical direction (Z axis direction), of the two vertical members 3a, 3a that form the frame 3. Under the horizontal member 3b of the frame 3, the plurality of (six in the embodiment) link brackets 5 on which the press bonding heads 8 are mounted through link mechanisms 7 for moving up and down the press bonding heads 8 are arranged side by side along the X axis direction. On a front surface of the beam member 4, a plurality of (six in the embodiment) sets each having the link bracket 5 and the auxiliary plate 6 that supports a press member 8a of the press bonding head 8 so that the press member 8a is movable upward and downward are arranged side by side along the X axis direction. The press bonding heads 8 are respectively mounted on the link brackets 5 through the link mechanisms 7 so as to be movable upward and downward, and a press bonding head driving unit 9 that actuates the plurality of (six in the embodiment) press bonding heads 8 so as to collectively move the heads upward and downward through the link mechanisms 7 in the link brackets 5 is provided on the beam member 4.

The substrate positioning unit 10 for holding the substrate PNL horizontal and carrying out the positioning of the substrate PNL is provided in a position in rear of the frame 3 on the base platform 2 with respect to a to-and-fro direction along the Y axis direction. Just under the frame 3 is provided a backup stage 11 that is an under receiving member for supporting an under surface of the side edge parts of the substrate PNL, from below, having undergone the positioning by the substrate positioning unit 10.

Figure 3:
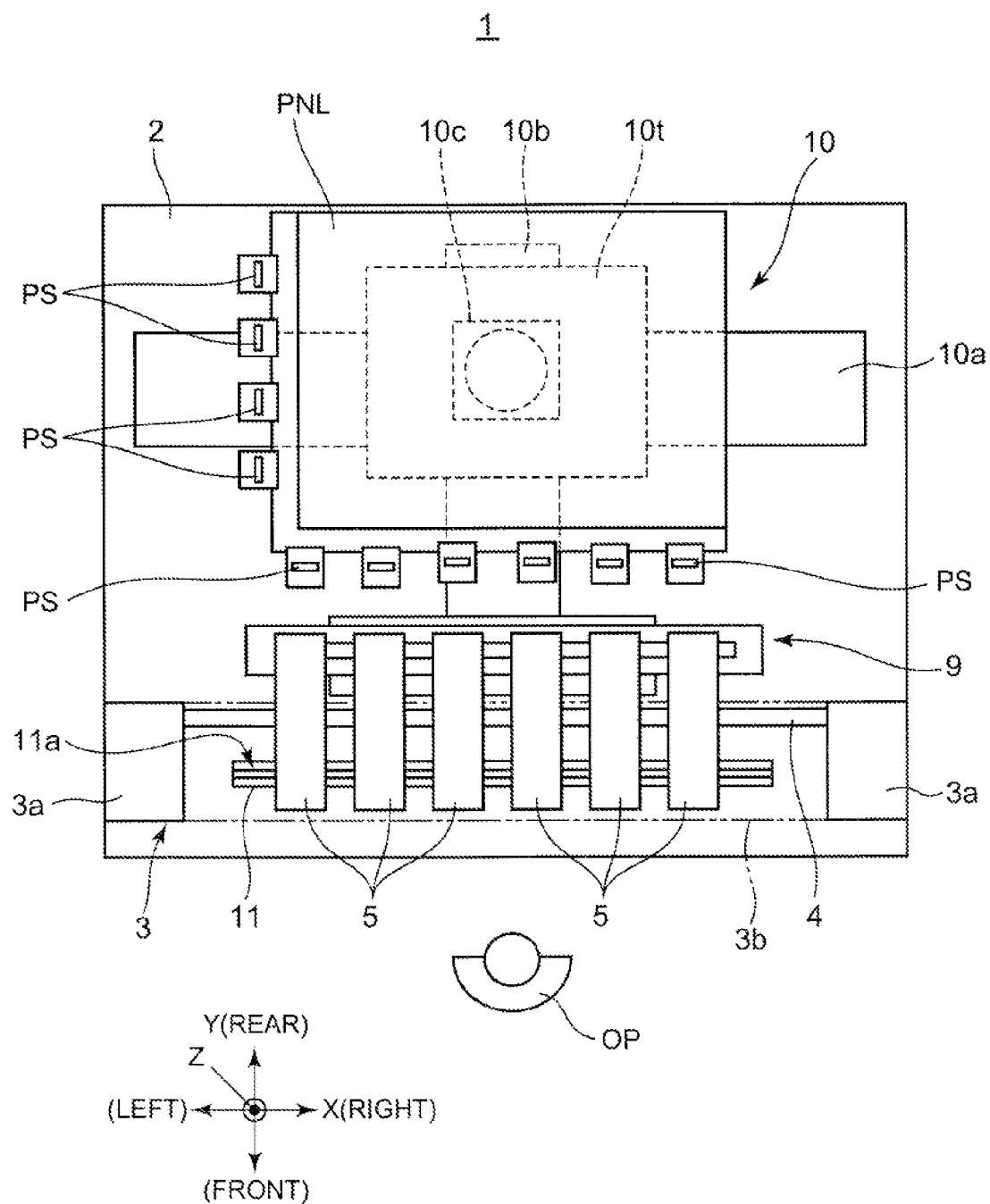
FIG. 3 is a partly omitted plan view of the component press bonding apparatus in accordance with the embodiment of the invention.
Figure 4:
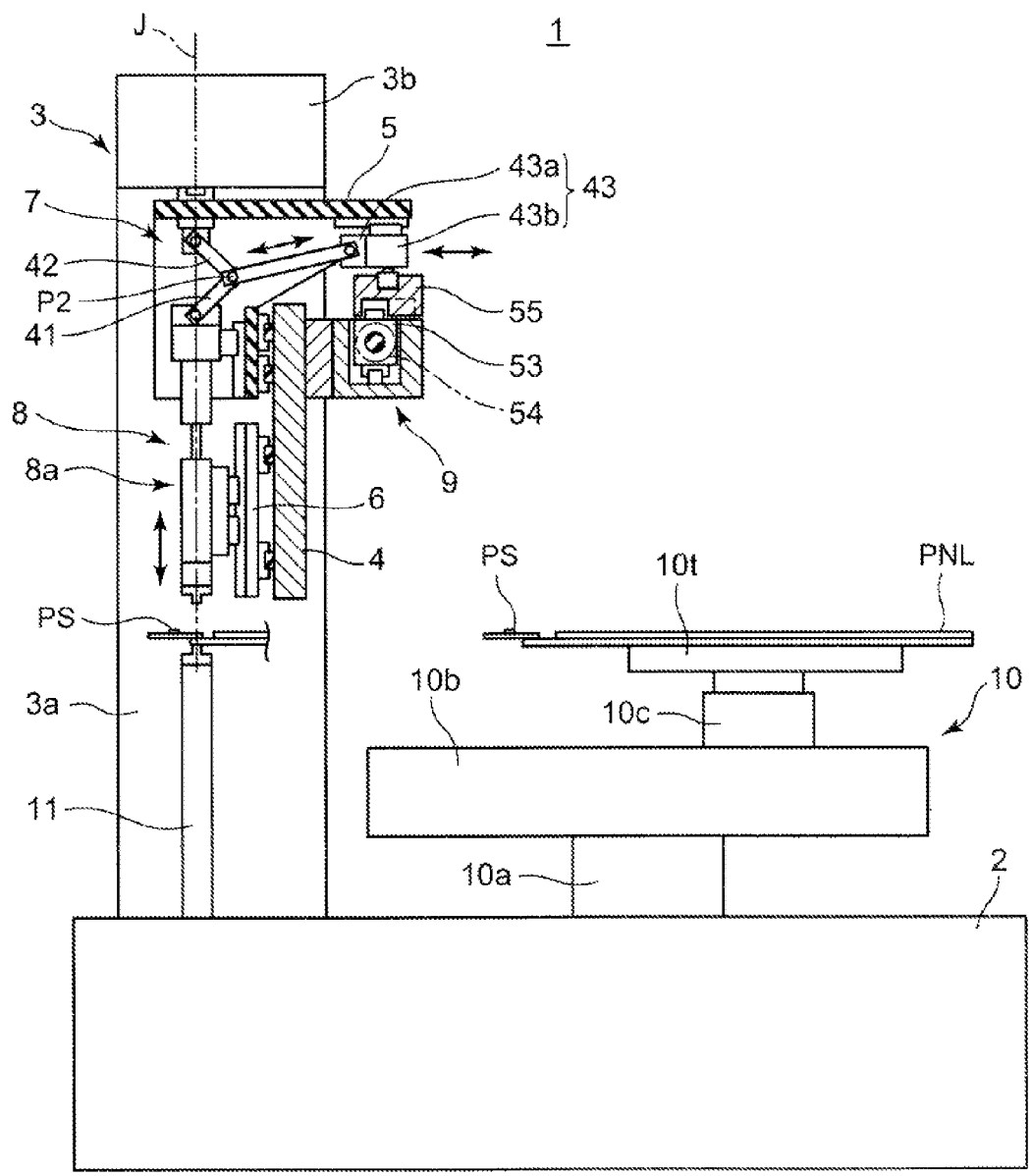
FIG. 4 is a side sectional view of the component press bonding apparatus in accordance with the embodiment of the invention.
Figure 5:
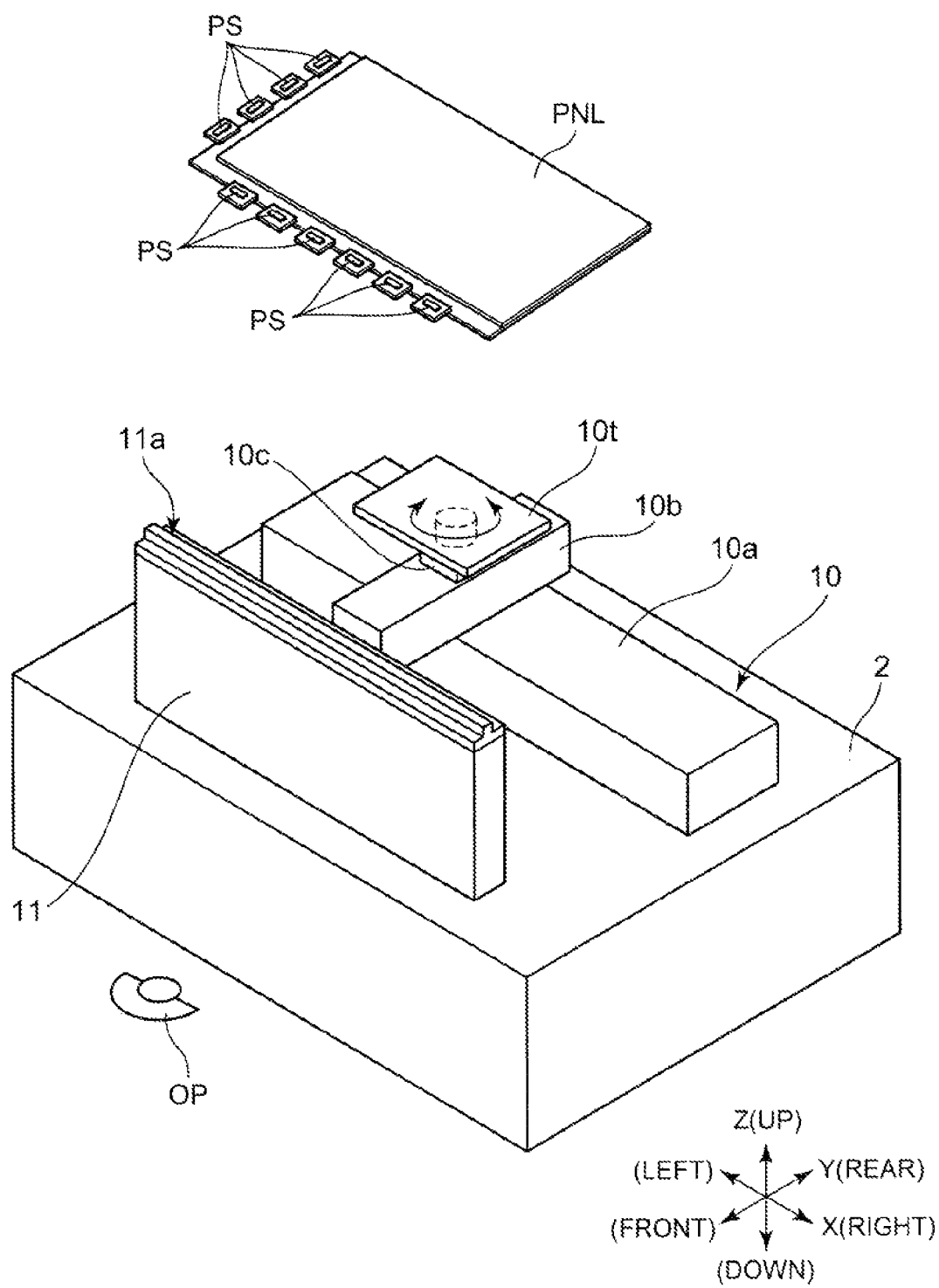
FIG. 5 is a partly omitted perspective view of the component press bonding apparatus in accordance with the embodiment of the invention.

As shown in FIGS. 3, 4 and 5, the substrate positioning unit 10 for performing hold and movement (positioning to a working position) of the substrate PNL is composed of an X axis table 10a, a Y axis table 10b, a θ axis table 10c, and a substrate placement table 10t. The X axis table 10a is provided on the base platform 2 so as to extend in the X axis direction and moves the substrate placement table 10t, holding the substrate PNL, in the X axis directions. The Y axis table 10b is placed on the X axis table 10a and moves the substrate placement table 10t in the Y axis directions. The θ axis table 10c is placed on the Y axis table 10b, moves up and down the substrate placement table 10t in the Z axis directions, and turns the substrate placement table 10t in θ directions. The substrate placement table 10t is fixed onto a top surface of the θ axis table 10c. A controller 12 (see FIG. 1) the press bonding apparatus 1 includes actuates the X axis table 10a, the Y axis table 10b, and the θ axis table 10c so as to move the substrate placement table 10t in directions within a horizontal plane (the directions of the X axis, the Y axis, the Z axis and the θ axis) and thereby performs the positioning of the substrate PNL, placed on the substrate placement table 10, to the working position where the components PS are to be press bonded onto the side edge parts of the substrate PNL.

In FIGS. 3 and 5, the substrate PNL in the embodiment has a rectangular shape and the components PS have been temporarily press bonded onto a plurality of mounting sites to be mounted with the components PS on the side edge parts of the substrate PNL, through joining members (conductive tapes in the embodiment) such as conductive tapes and conducting agent.

In FIGS. 3, 4 and 5, the backup stage 11 is the under receiving member that supports the side edge parts of the substrate PNL and that extends in the X axis direction, and a backup surface 11a composed of a horizontal top surface of the backup stage 11 supports the under surface of the side edge parts of the substrate PNL, from below, placed on the substrate positioning unit 10.

Figure 6:
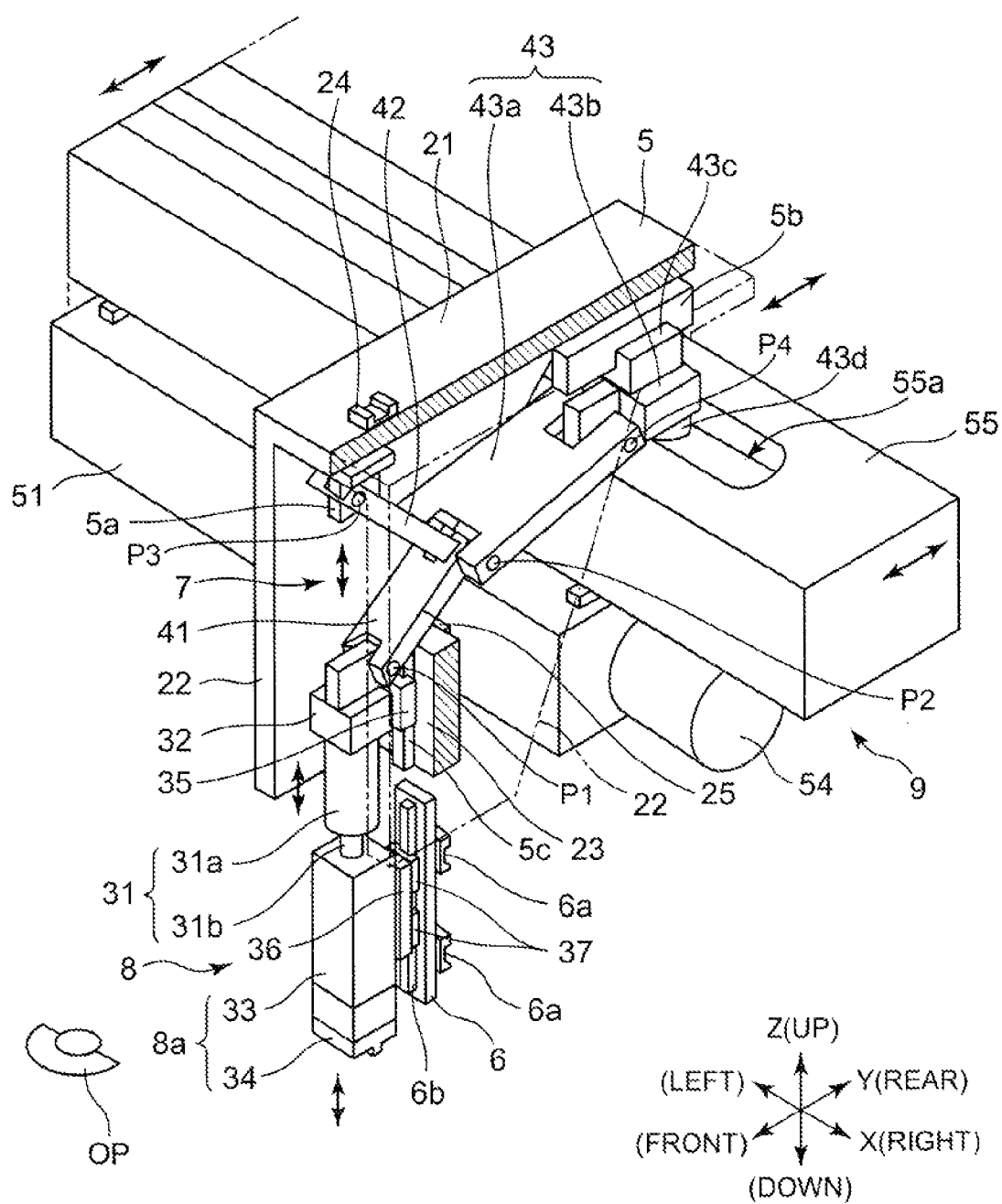
FIG. 6 is a fragmentary perspective view, partly in section, of the component press bonding apparatus in accordance with the embodiment of the invention.
Figure 7:
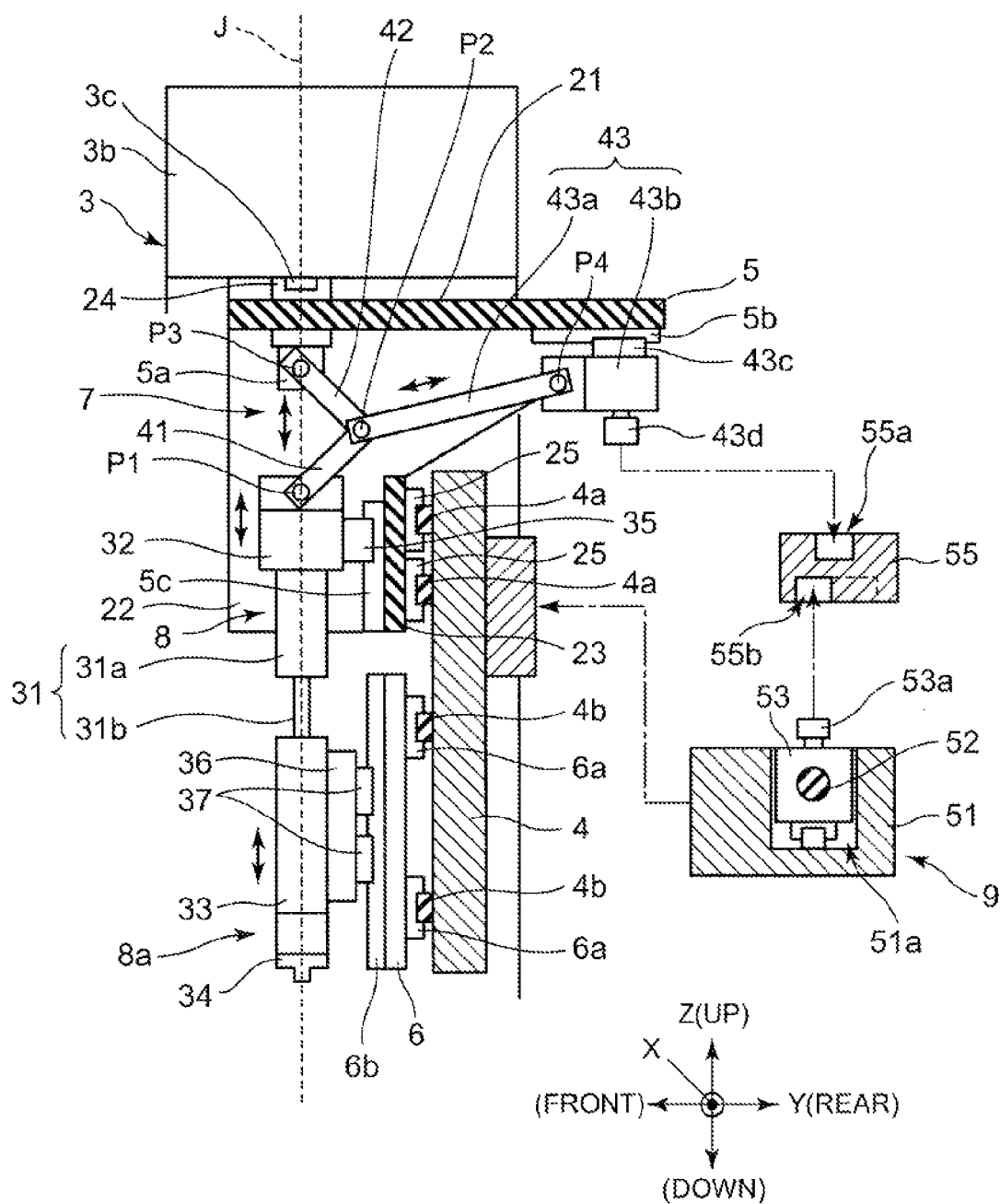
FIG. 7 is a fragmentary side view, partly in section, of the component press bonding apparatus in accordance with the embodiment of the invention.

In FIGS. 6 and 7, the link bracket 5 on which the press bonding head 8 is mounted through the link mechanism 7 for moving up and down the press bonding head 8 has a horizontal top wall part 21 and an intermediate wall part 23 that is, provided in parallel with the beam member 4 between a pair of side wall parts 22 that are provided so as to extend downward from both end sides of the top wall part 21 with respect to the X axis direction. On a top surface of the top wall part 21 is provided a first guide block 24 engaged slidably with a first X axis guide rail 3c (see FIGS. 1, 2, and 7) that is provided on a bottom surface of the horizontal member 3b of the frame 3 so as to extend in the X axis direction. On a back surface of the intermediate wall part 23 are provided two bracket second guide blocks 25 engaged slidably with a pair of upper and lower second X axis guide rails 4a that are provided on the front surface of the beam member 4 so as to extend in the X axis direction (see FIGS. 2 and 7). Thus each link bracket 5 having the press bonding head 8 and the link mechanism 7 for moving up and down the press bonding head 8 is configured so as to be movable in the X axis directions (transversal directions) relative to the frame 3.

Each auxiliary plate 6 that supports the press member 8a of the press bonding head 8 so that the press member 8a is movable upward and downward has a pair of auxiliary plate guide blocks 6a placed in upper and lower positions on a back surface of the plate 6. The pair of auxiliary plate guide blocks 6a are positioned under the second X axis guide rails 4a provided on the front surface of the beam member 4 having both the ends mounted on the middle parts, with respect to the vertical direction, of the vertical members 3a, 3a of the frame 3 and are slidably engaged with a pair of upper and lower third X axis guide rails 4b that extend in the X axis direction and that are provided on the front surface of the beam member 4. Thus each auxiliary plate 6 is configured so as to be movable in the X axis directions (transversal directions) relative to the frame 3.

In FIGS. 6 and 7, each press bonding head 8 has a pneumatic cylinder 31 that includes a cylinder body 31a and a piston rod 31b and that is provided so as to extend in the vertical direction so that the cylinder body 31a is in the upper position, an upper attachment 32 provided on an upper end (of the cylinder body 31a) of the pneumatic cylinder 31, and the press member 8a provided on a lower end of the piston rod 31b of the pneumatic cylinder 31. The press member 8a has a press bonding tool holding member 33 and a press bonding tool 34 mounted on a lower end of the press bonding tool holding member 33.

On a back surface of the upper attachment 32, an upper attachment guide block 35 engaged slidably with a first Z axis guide rail 5c that is provided on a front surface of the intermediate wall part 23 of the link bracket 5 so as to extend in the Z axis direction is provided and supports the pneumatic cylinder 31 so that the pneumatic cylinder 31 is movable in the vertical directions. A lower attachment 36 is provided on a back surface of the press bonding tool holding member 33 of the press member 8a. On a back surface of the lower attachment 36, lower attachment guide blocks 37 engaged slidably with a second Z axis guide rail 6b that is provided on a front surface of the auxiliary plate 6 so as to extend in the Z axis direction are provided and support the press member 8a so that the press member 8a is movable in the vertical directions.

By the press bonding head support part that is composed of the beam member 4, the link brackets 5, the auxiliary plates 6 and the like and that supports the plurality of press bonding heads 8 so that the heads 8 are independently movable upward and downward, accordingly, the press bonding heads 8 can be moved together with the link brackets 5 and the auxiliary plates 6 in the X axis directions relative to the frame 3 and can be moved in the Z axis directions (i.e., moved upward and downward) relative to the frame 3. That is, the plurality of press bonding heads 8 are supported by the frame 3 through the press bonding head support part so as to be movable in the X axis directions and the Z axis directions.

The press bonding heads 8 are placed so that the press bonding tools 34 the press bonding heads 8 have are positioned immediately over the backup surface 11a of the backup stage 11 that is the under receiving member for supporting the side edge parts of the substrate PNL (see FIG. 4).

As shown in FIGS. 4, 6 and 7, the link mechanisms 7 that are provided in the press bonding head support part so as to correspond to the press bonding heads 8 and that respectively move up and down the press bonding heads 8 are each composed of a first link member 41, a second link member 42, and a connection slide part 43 that are connected to one another. The first link member 41 has one end that is pivotably connected to an upper end of the press bonding head 8 by a first connection pin P1 and the other end that is in a position in rear of the press bonding head 8 with respect to the Y axis direction and diagonally above relative to the one end. The second link member 42 has one end that is pivotably connected to the other end of the first link member 41 by a second connection pin P2 and the other end that is pivotably connected by a third connection pin P3 to a protruding part 5a protruding downward from the link bracket 5 above the press bonding head 8 (on upper side on an up-and-down axis J of the press bonding head 8 in the embodiment). The connection slide part 43 is connected to the second connection pin P2 that connects the first link member 41 and the second link member 42.

The connection slide part 43 is composed of a third link member 43a having one end connected to the second connection pin P2 and the other end positioned in rear of the second connection pin P2 with respect to the Y axis direction and a connection slide member 43b having one end to which the other end of the third link member 43a is pivotably connected by a fourth connection pin P4. The connection slide member 43b has a guide block 43c engaged slidably with a first Y axis guide rail 5b that is provided on a bottom surface of the top wall part 21 of the link bracket 5 so as to extend in the Y axis direction, and is movable in the Y axis directions (the to-and-fro directions) relative to the frame 3.

Figure 8A:
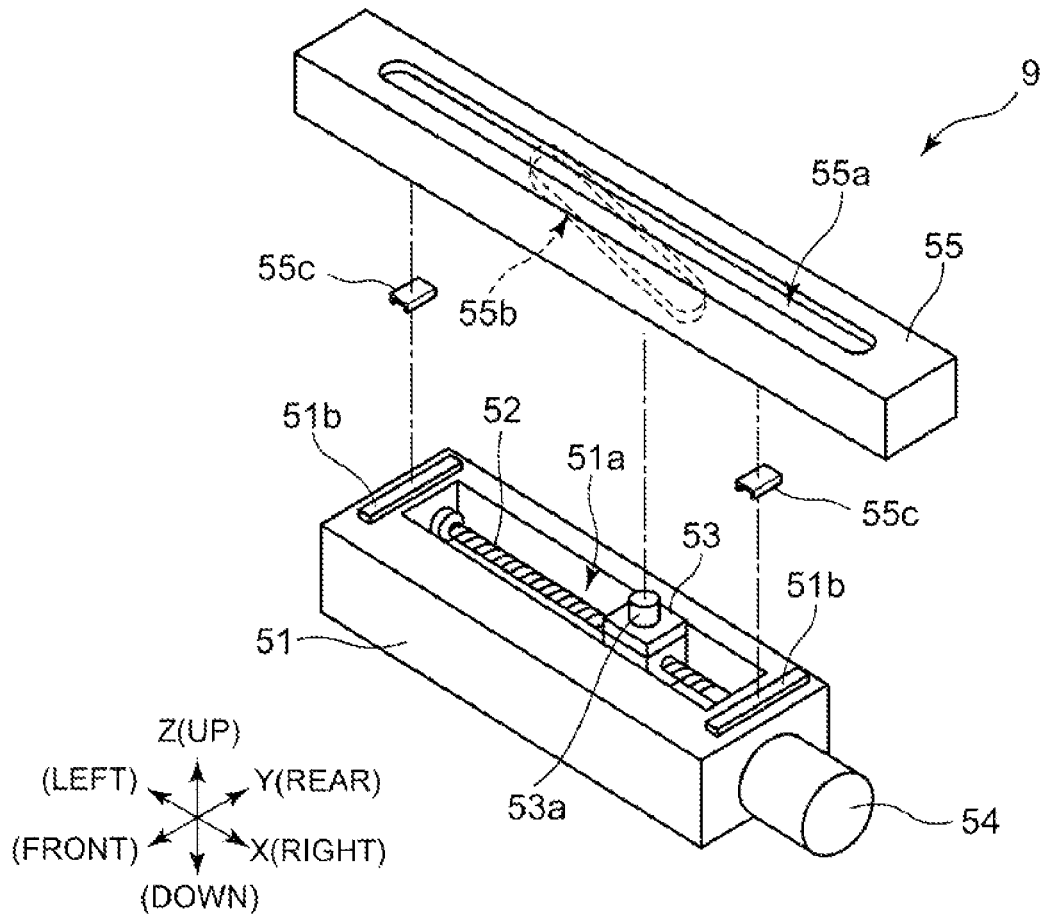
FIG. 8A is an exploded perspective view of a press bonding head driving unit the component press bonding apparatus in accordance with the embodiment of the invention includes.
Figure 8B:
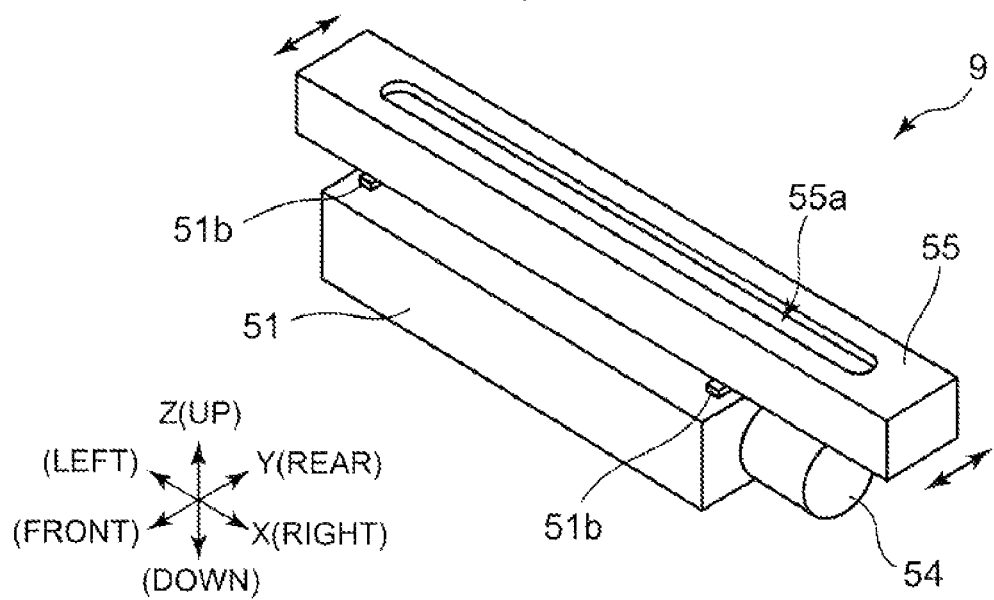
FIG. 8B is a perspective view of the press bonding head driving unit the component press bonding apparatus in accordance with the embodiment of the invention includes.
Figure 9A:
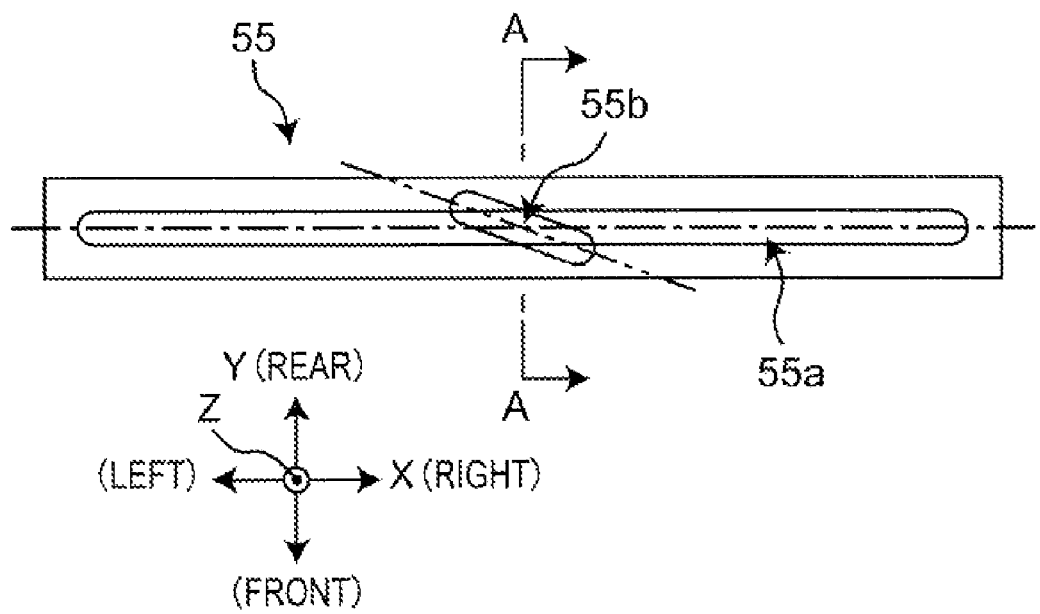
FIG. 9A is a plan view of a Y axis slider the press bonding head driving unit of the component press bonding apparatus in accordance with the embodiment of the invention includes.
Figure 9B:
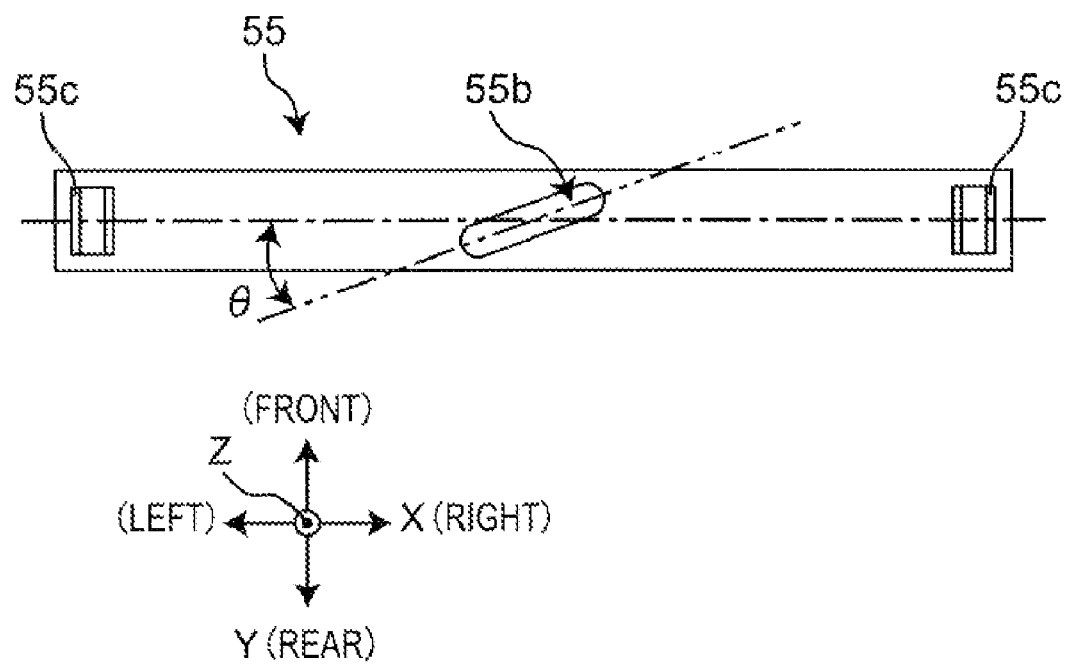
FIG. 9B is a bottom view of the Y axis slider the press bonding head driving unit of the component press bonding apparatus in accordance with the embodiment of the invention includes.

In FIGS. 4 and 7, the press bonding head driving unit 9 is mounted on back face (with respect to the Y axis direction) of the beam member 4 as seen looking from the operator OP. As shown in FIGS. 8A and 8B, the press bonding head driving unit 9 has a ball screw holding member 51 that has an X axis slider moving space 51a opening upward and extending in the X axis direction, a ball screw 52 that is provided so as to extend in the X axis direction in the X axis slider moving space 51a, an X axis slider 53 that is provided so as to be movable in the X axis direction in the X axis slider moving space 51a and that is moved in the X axis direction by the ball screw 52 making axial rotations about the X axis, a driving motor 54 that drives the ball screw 52 to rotate about the X axis, and a Y axis slider 55 that is placed above the ball screw holding member 51.

When the driving motor 54 is run by control from the controller 12, the ball screw 52 is driven about the X axis, and the X axis slider 53 is thereby moved in the X axis slider moving space 51a in the X axis direction, that is, in the direction of the side-by-side arrangement of the plurality of press bonding heads 8. Switching of the direction in which the X axis slider 53 is moved in the X axis directions is attained by a change in a direction of rotation of the driving motor 54 by the controller 12.

In FIGS. 6, 8A, 8B, and 9A through 9C, the Y axis slider 55 placed above the ball screw holding member 51 has a shape extending in the X axis direction, and a top surface groove 55a (connection groove) opening upward and extending in the X axis direction is provided on a top surface thereof. A bottom surface groove 55b opening downward and extending at a specified angle θ (θ is the angle between 10 and 30 degrees, for instance, 20 degrees in the example) with the X axis direction in the horizontal plane is provided on a bottom surface of the Y axis slider 55. A protrusion (cam follower) 53a that is provided so as to protrude and extend upward from a top surface of the X axis slider 53 is fitted into the bottom surface groove 55b from below. On the bottom surface on both end sides with respect to the X axis direction of the Y axis slider 55, guide blocks 55c are provided that are engaged with second Y axis guide rails 51b which are provided in positions facing both the end sides on a top surface on both end sides with respect to the X axis direction of the ball screw holding member 51 so as to extend in the Y axis direction and that slide in the Y axis directions.

With movement of the X axis slider 53 in the X axis direction that is the direction of the side-by-side arrangement of the plurality of press bonding heads 8, the protrusion (cam follower) 53a on the X axis slider 53 moves in the X axis direction while pressing a wall surface in the bottom surface groove 55b of the Y axis slider 55 and the Y axis slider 55 is thereby moved in the Y axis direction while making the guide blocks 55c slide on the second Y axis guide rails 51b.

Figure 10A:
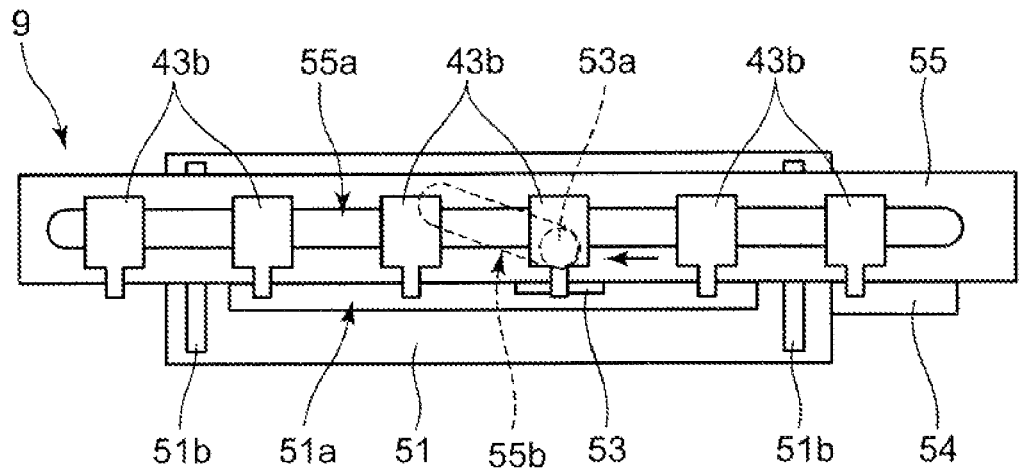
FIG. 10A is an illustration of operation (plan view of important part) of the press bonding head driving unit the component press bonding apparatus in accordance with the embodiment of the invention includes.
Figure 10A:
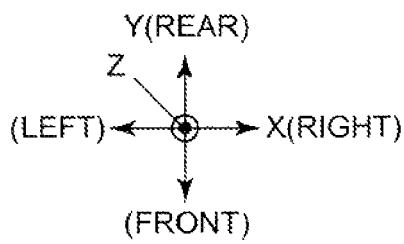
Figure 10B:
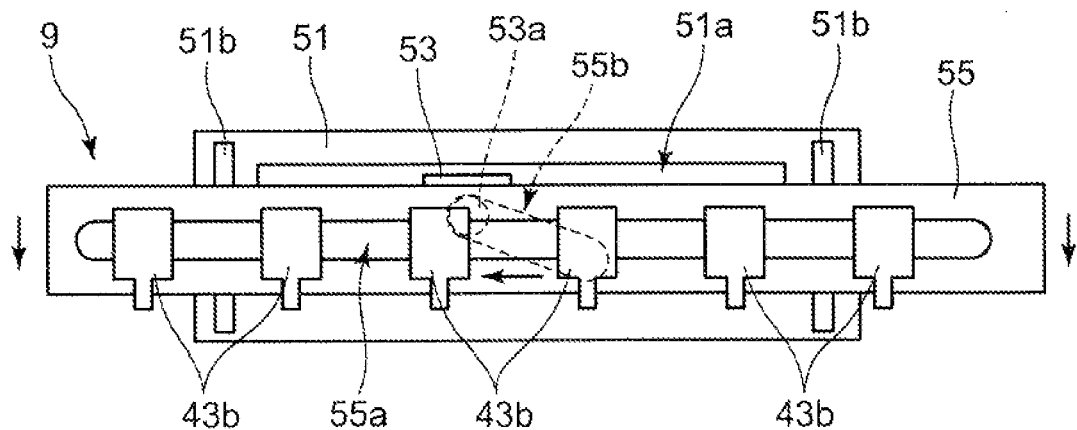
FIG. 10B is an illustration of operation (plan view of important part) of the press bonding head driving unit the component press bonding apparatus in accordance with the embodiment of the invention includes.
Figure 10B:
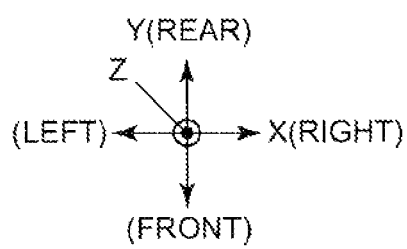

In the embodiment, as shown in FIGS. 8A, 8B, 9A through 9C, 10A and 10B, the bottom surface groove 55b provided on the bottom surface of the Y axis slider 55 extends from front right side to rear left side in the drawings with an inclination with respect to the X axis direction in FIGS. 10A and 10B in the horizontal plane as seen looking from upper side of the press bonding apparatus 1 with respect to the Z axis direction. When the protrusion (cam follower) 53a on the X axis slider 53 is moved from right side to left side in the drawings in the X axis direction for the frame 3 by an operation of the driving motor 54 in one direction (which will be referred to as a forward direction), accordingly, the Y axis slider 55 moves from rear side to front side in the Y axis direction for the frame 3 (that is, transfers from a state shown in FIG. 10A to a state shown in FIG. 10B (see FIG. 12)).

When the protrusion (cam follower) 53a on the X axis slider 53 is moved from the left side to the right side in the drawings in the X axis direction for the frame 3 by an operation of the driving motor 54 in the other direction (which will be referred to as a reverse direction opposite to the forward direction), accordingly, the Y axis slider 55 moves from the front side to the rear side in the Y axis direction for the frame 3 (that is, transfers from the state shown in FIG. 10B to the state shown in FIG. 10A (see FIG. 11)).

Figure 11:
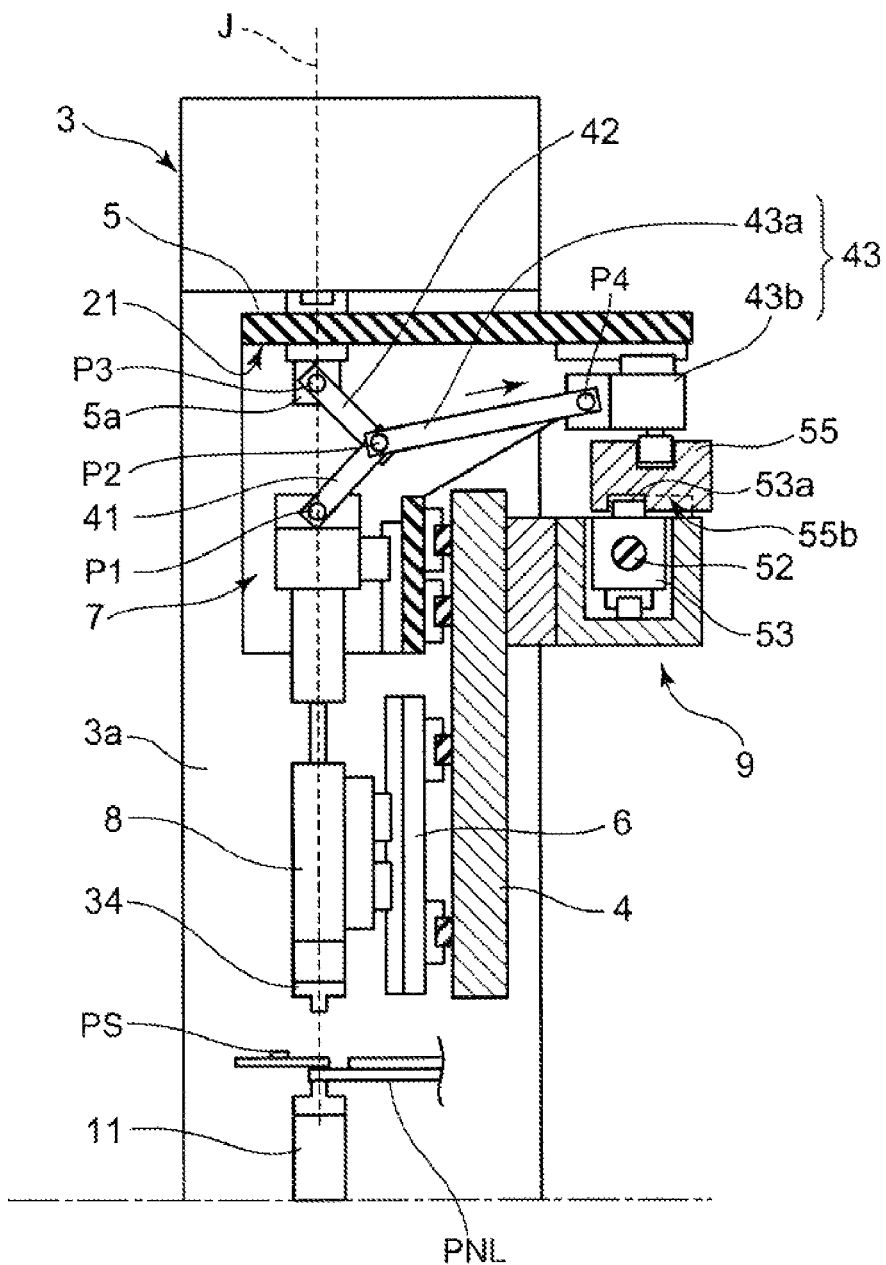
FIG. 11 is an illustration of operation (side sectional view of important part) of the component press bonding apparatus in accordance with the embodiment of the invention.
Figure 11:
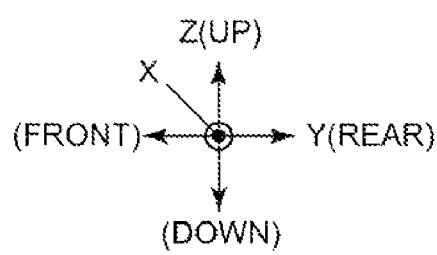
Figure 12:
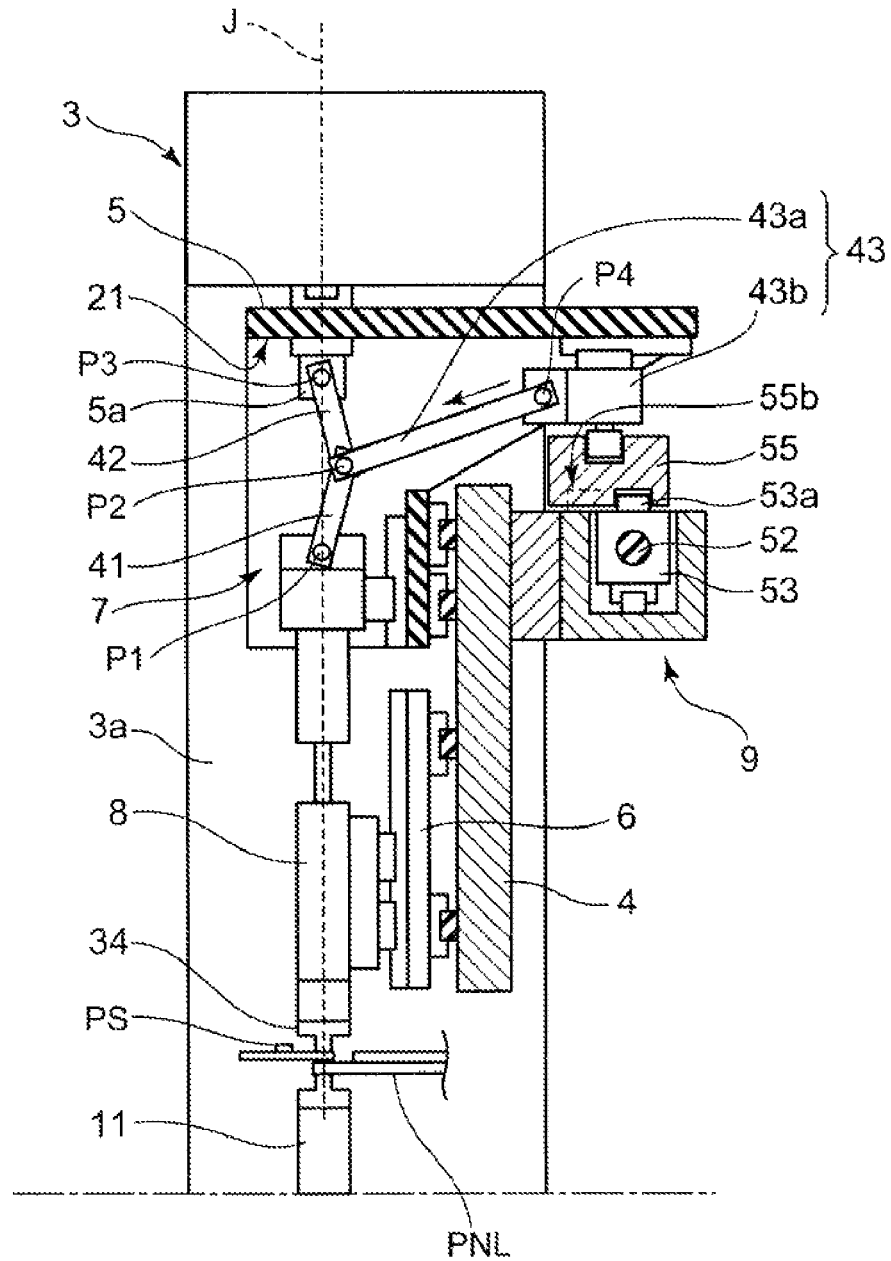
FIG. 12 is an illustration of operation (side sectional view of important part) of the component press bonding apparatus in accordance with the embodiment of the invention.
Figure 12:
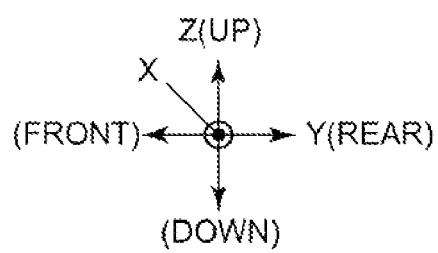
Figure 13:
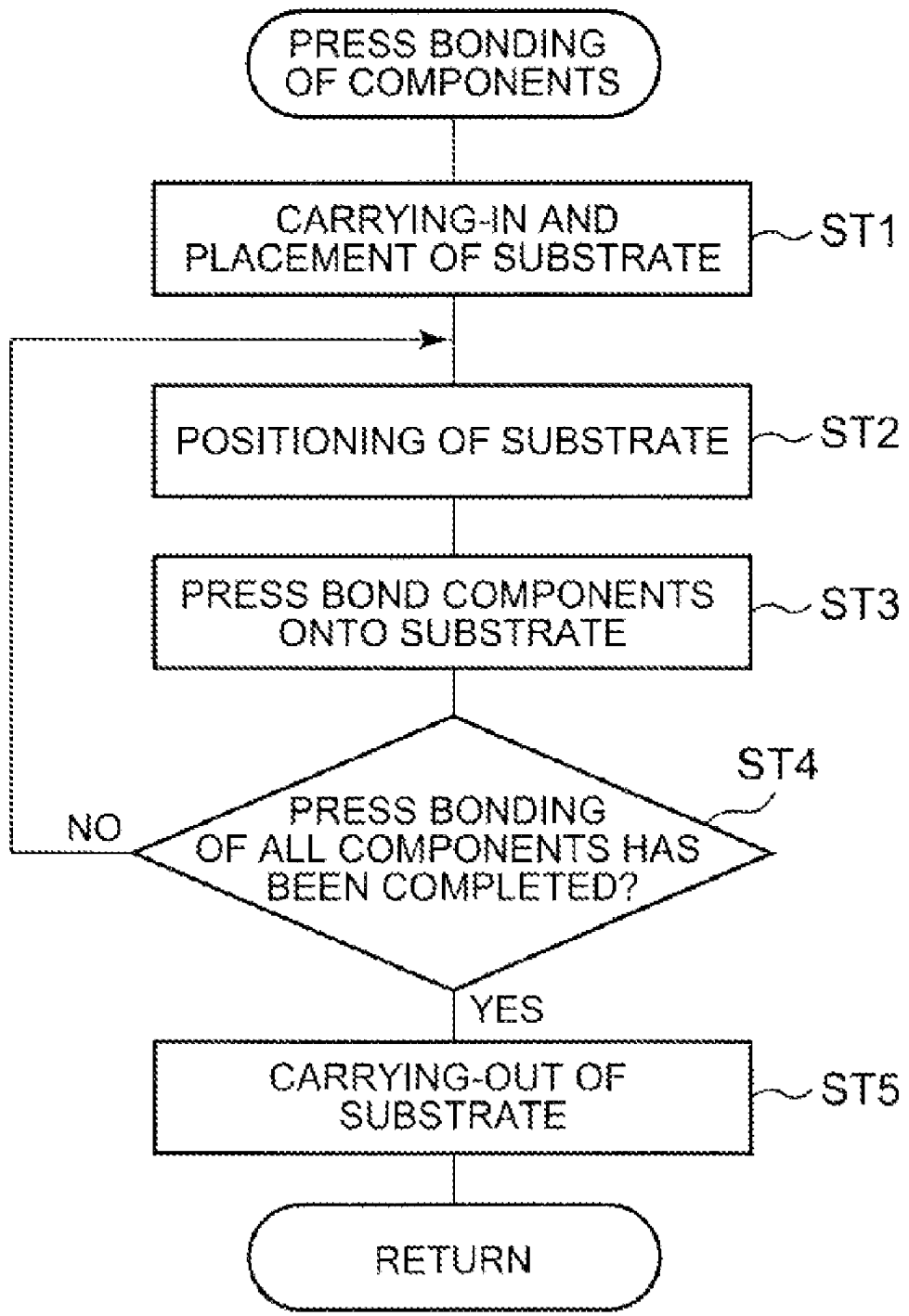
FIG. 13 is a flow chart showing procedures of operation of the component press bonding apparatus in accordance with the embodiment of the invention.

That is, the bottom surface groove 55b on the Y axis slider 55 and the protrusion (cam follower) 53a on the X axis slider 53 form a cam mechanism of groove cam type, the X axis slider 53 is reciprocated by the driving motor 54 in the directions (X axis directions) of the side-by-side arrangement of the plurality of press bonding heads 8, and the Y axis slider 55 is thereby moved through the cam mechanism in the horizontal directions (Y axis directions) orthogonal to the directions (X axis directions) of the side-by-side arrangement of the plurality of press bonding heads 8 (see FIGS. 11 and 12).

As shown in FIGS. 6, 7, 11, 12 and the like, protrusions (cam followers) 43d that are provided so as to protrude downward from bottom surfaces of the connection slide members 43b of the connection slide parts 43 in the link mechanisms 7 are fitted from above into the top surface groove 55a of the Y axis slider 55 that is configured so that the link brackets 5 having the link mechanisms 7 for the press bonding heads 8 can be slid in the X axis directions. A size of the protrusions (cam followers) 43d on the connection slide parts 43 in the Y axis direction is set so as to be slightly smaller than a groove width (internal size in the Y axis direction) of the top surface groove 55a on the Y axis slider 55, so that the reciprocation of the Y axis slider 55 in the Y axis directions causes reciprocation of the connection slide parts 43 of the link mechanisms 7 in the Y axis directions.

With movement of the protrusion (cam follower) 53a on the X axis slider 53 from the right side to the left side in the drawings in the X axis direction for the frame 3, as shown in FIGS. 10A and 10B, the Y axis slider 55 advances in the Y axis direction (that is, advances from the state shown in FIG. 10A to the state shown in FIG. 10B).

When the connection slide part 43 thereby moves forward in the Y axis direction (that is, transfers from a state shown in FIG. 11 to a state shown in FIG. 12) as shown in FIG. 12, the second connection pin P2 that is connected to the one end of the connection slide part 43 and that is a connection part between the one end side of the second link member 42 and the other end side of the first link member 41 moves forward in the Y axis direction. Then the second link member 42 swings on a third connection pin P3 as a fulcrum because the other end side of the second link member 42 is fixedly connected to the protruding part 5a of the link bracket 5 by the third connection pin P3 so as not to move in the Y axis direction and the Z axis direction. Thus the second connection pin P2 that is the connection part connecting the other end of the first link member 41 and the one end of the second link member 42 moves toward lower front side with respect to the Y axis direction. As a result, the first link member 41 and the second link member 42 move so as to open in the vertical directions with the second connection pin P2 functioning as a fulcrum. Consequently, one end of the first link member 41 on lower end side moves downward, and the press bonding head 8 is lowered of which the upper end is connected to the one end of the first link member 41 by the first connection pin P1 (FIG. 12).

With movement of the protrusion (cam follower) 53a on the X axis slider 53 from the left side to the right side in the drawings in the X axis direction for the frame 3, as shown in FIGS. 10A and 10B, on the other hand, the Y axis slider 55 retreats in the Y axis direction (that is, retreats from the state shown in FIG. 10B to the state shown in FIG. 10A).

When the connection slide part 43 thereby moves rearward in the Y axis direction as shown in FIG. 11, the second connection pin P2 that is connected to the one end of the connection slide part 43 and that is the connection part between the one end side of the second link member 42 and the other end side of the first link member 41 moves rearward in the Y axis direction.

Then the other end side of the second link member 42 swings on the third connection pin P3, as the fulcrum, which is fixedly connected to the protruding part 5a of the link bracket 5 so as not to move in the Y axis direction and the Z axis direction. As a result, the second connection pin P2 that is the connection part connecting the other end of the first link member 41 and the one end of the second link member 42 moves toward upper rear side with respect to the Y axis direction, and the first link member 41 and the second link member 42 move so as to close in the vertical directions with the second connection pin P2, which is the connection part thereof, functioning as the fulcrum.

Consequently, the one end of the first link member 41 on the lower end side moves upward, and the press bonding head 8 is raised of which the upper end is connected to the one end of the first link member 41 by the first connection pin P1 (FIG. 11).

The expression "the first link member 41 and the second link member 42 move so as to open in the vertical directions with the second connection pin P2 functioning as the fulcrum" in the embodiment means that the first link member 41 and the second link member 42 move so as to get away from each other or move so that an angle between the first link member 41 and the second link member 42 increases. The expression "the first link member 41 and the second link member 42 move so as to close in the vertical directions with the second connection pin P2 functioning as the fulcrum" means that the first link member 41 and the second link member 42 move so as to get close to each other or move so that the angle between the first link member 41 and the second link member 42 decreases.

In order that the press bonding (what is called main press bonding) onto the substrate PNL of the components PS temporarily press bonded on the side edge parts of the substrate PNL may be performed by the press bonding heads 8, in FIGS. 1, 2, 4, and 13, the controller 12 initially actuates a substrate conveyor device not shown to carry the substrate PNL into the press bonding apparatus 1, places the substrate PNL on the substrate placement table 10t of the substrate positioning unit 10 (step ST1 in FIG. 13), and thereafter controls operation of the substrate positioning unit 10 to perform the positioning of the substrate PNL (step ST2). In the positioning of the substrate PNL, the components PS on the side edge parts of the substrate PNL are positioned just under the press bonding tools 34 of the press bonding heads 8. The under surface of parts of the side edge parts of the substrate PNL on which the components PS are temporarily press bonded is thereby supported from below by the backup surface 11a of the backup stage 11. When positions of the press bonding head 8 are required to be moved in the X axis directions in accordance with positions of the components PS temporarily press bonded on the substrate PNL in the positioning of the substrate PNL, the press bonding heads 8 are slid in the X axis directions together with the link brackets 5 on which the press bonding heads 8 are mounted so that pitches (that is, intervals in the X axis direction) among the press bonding heads 8 are changed.

After attaining the positioning on the substrate PNL, the controller 12 drives and runs the driving motor 54 so as to press bond the components PS onto the substrate PNL (step ST3). An operation of the driving motor 54 in the forward direction simultaneously (collectively) lowers and brings the six press bonding heads 8 into contact with the side edge parts of the substrate PNL from above and causes the press bonding tools 34 of the press bonding heads 8 to press the components PS, just under the tools, against the substrate PNL (then the components PS are heated by heaters that are provided on the press bonding tools 34 and that are not shown), and thus the press bonding (main press bonding) of the components PS onto the side edge parts of the substrate PNL is attained. Forces with which the press bonding tools 34 press the components PS are set by pressures supplied into the pneumatic cylinders 31.

Subsequently, an operation of the driving motor 54 in the reverse direction simultaneously raises the six press bonding heads 8 and separates the press bonding tools 34 of the press bonding heads 8 from the components PS.

After the press bonding (main press bonding) of the components PS onto the side edge parts of the substrate PNL, the controller 12 determines whether the press bonding of all the components PS that are to be press bonded onto the substrate PN has been completed or not (step ST4). If the press bonding of all the components PS has not been completed, components PS that have not yet been press bonded onto the side edge parts of the substrate PNL are positioned just under the press bonding heads 8 with return to the step ST2, and then the press bonding (main press bonding) of the components PS onto the side edge parts of the substrate PNL is carried out in the step ST3. Positioning of the substrate PNL in switching between an operation of press bonding the components PS for long sides of the substrate PNL and an operation of press bonding the components PS for short sides of the substrate PNL is carried out by a 90 degrees turn of the substrate placement table 10t of the substrate positioning unit 10 in the θ direction.

If the press bonding of all the components PS that are to be press bonded onto the substrate PN on which the operation of press bonding the components PS is being performed at present has been completed in the step ST4, on the other hand, the controller 12 activates the substrate conveyor device described above and not shown to carry the substrate PNL on the substrate positioning unit 10 out of the press bonding apparatus 1 (step ST5).

In the press bonding apparatus 1 in accordance with the embodiment, the plurality of press bonding heads 8 arranged side by side in the frame 3 are respectively moved up and down by the closing and opening actuation of the first link members 41 and the second link members 42 that form the link mechanisms 7, and thus most of reaction forces caused by the contact of the press bonding heads 8 with the substrate PNL can be exerted through the link brackets 5 on the frame 3, so that the forces that act on the press bonding head driving unit 9 can be decreased. Accordingly, a small-sized unit having low rigidity and low strength can be used as the press bonding head driving unit 9 that collectively actuates the plurality of press bonding heads 8 so as to press bond the plurality of components PS on the substrate PNL, so that the whole press bonding apparatus 1 can be made compact. The press bonding head driving unit 9 can be decreased in size, and thus the press bonding heads 8 can be actuated at high speed so that productivity for the substrates PNL can be improved. The connection slide part 43 has only to be driven in the horizontal directions in order to open and close the first link member 41 and the second link member 42, thus the press bonding head driving unit 9 that collectively actuates the plurality of press bonding heads 8 can be configured so as to be actuated in the horizontal directions in which comparatively large margins of space exist, instead of being actuated in the vertical directions as in the conventional apparatuses, and the whole press bonding apparatus 1 can be made compact from this aspect also.

In the press bonding apparatus 1 in accordance with the embodiment, the press bonding head driving unit 9 includes the X axis slider 53 (first slider) that is reciprocated in the directions (X axis directions) of the side-by-side arrangement of the plurality of press bonding heads 8, and the Y axis slider 55 (second slider) that is connected to the connection slide parts 43 of the link mechanisms 7 and that is driven by the X axis slider 53 through the cam mechanism of groove cam type (the bottom face groove 55b on the Y axis slider 55 and the protrusion (cam follower) 53a on the X axis slider 53) so as to move the connection slide parts 43 of the link mechanisms 7 in the directions (Y axis directions) orthogonal to the directions of the side-by-side arrangement of the plurality of press bonding heads 8. Thus the direction of actuation of the press bonding head driving unit 9 that collectively actuates the plurality of press bonding heads 8 can be set in the X axis direction that is the direction of the side-by-side arrangement of the plurality of press bonding heads 8 in which the largest margins of space exist of those in the horizontal directions, so that the press bonding apparatus 1 can be made more compact.

The press bonding head driving unit 9 includes the cam mechanism (e.g., groove cam mechanism having the inclined groove) that is reciprocated in the directions (X axis directions) of the side-by-side arrangement of the plurality of press bonding heads 8 and that has the inclination of the specified angle θ with the X axis direction, and thus the reaction forces caused by the contact of the press bonding heads 8 with the substrate PNL that is brought about by the actuation of the link mechanisms 7 can further be decreased. This allows a driving actuator (the driving motor 54) of the press bonding head driving unit 9 to be decreased in size and allows the press bonding head driving unit 9 to be made compact.

Though the embodiment of the invention has been described, the invention is not limited to what has been shown in the embodiment described above.

For instance, the embodiment described above has the six press bonding heads, whereas there have only to be provided a plurality of press bonding heads, that is, two or more press bonding heads.

Though the link brackets 5 provided on the frame 3 and supporting the link mechanisms 7 that support the plurality of press bonding heads 8 so as to be capable of respectively moving the heads upward and downward are provided corresponding to the respective press bonding heads 8 in the embodiment described above, link brackets may be provided so that each thereof corresponds to a plurality of press bonding heads 8.

The press bonding heads 8 can be moved in the transversal directions (X axis directions) along which the plurality of press bonding heads 8 are arranged side by side in the frame 3, whereas such a configuration is not necessarily required. That is, it goes without saying that the above configuration does not have to be provided unless the pitches among the press bonding heads 8 that press bond the components PS onto the substrate PNL are required to be changed.

Though the apparatus in which the Y axis slider 55 of the press bonding head driving unit 9 advances and reverses the connection slide parts 43 in the Y axis directions that are the horizontal directions by sliding in the Y axis directions that are the horizontal directions has been described as an example, the Y axis slider 55 and the connection slide parts 43 have only to have moving vector components at least in the Y axis directions, and a configuration may be employed in which the Y axis slider 55 and the connection slide parts 43 move in directions that are inclined with respect to the horizontal directions, for instance.

Though the example that employs a configuration in which the press bonding head support part (composed of the beam member 4, the link brackets 5, the auxiliary plates 6 and the like) supporting the plurality of press bonding heads 8 so that the press bonding heads 8 can be moved upward and downward is supported by the frame 3 has been described in the embodiment described above, a manner of supporting the press bonding heads 8 is not limited to only such a configuration.

Figure 14:
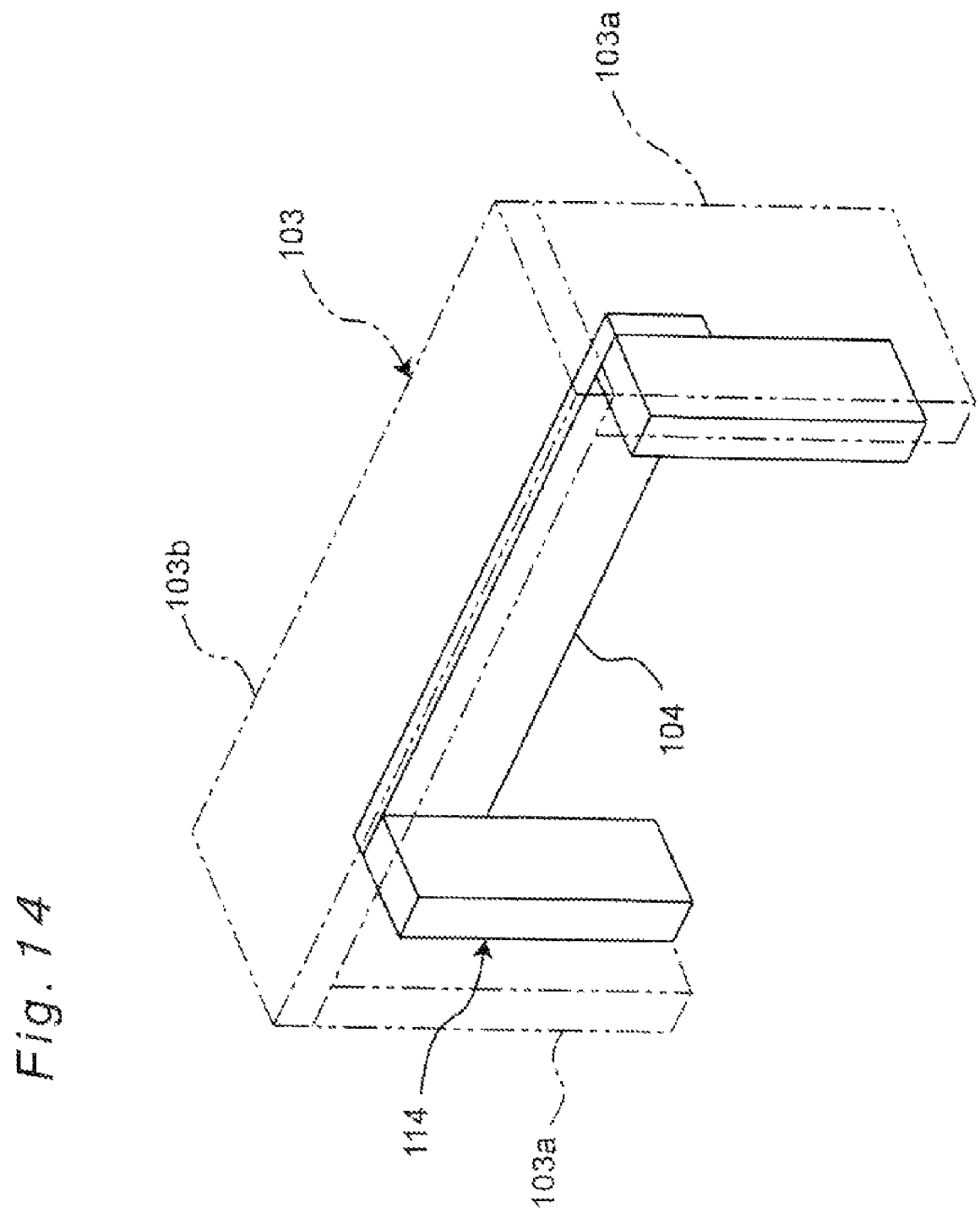
FIG. 14 is a schematic diagram of a double frame structure a component press bonding apparatus in accordance with a modification of the embodiment of the invention has.

For a press bonding apparatus in accordance with a modification of the embodiment described above, for instance, a double frame structure may be employed that includes an outer frame 103 (second frame) and an inner frame 114 (first frame) that is separate from the outer frame 103 and that is independently fixed onto a base platform of the press bonding apparatus, as shown in a schematic illustration of FIG. 14.

Figure 15:
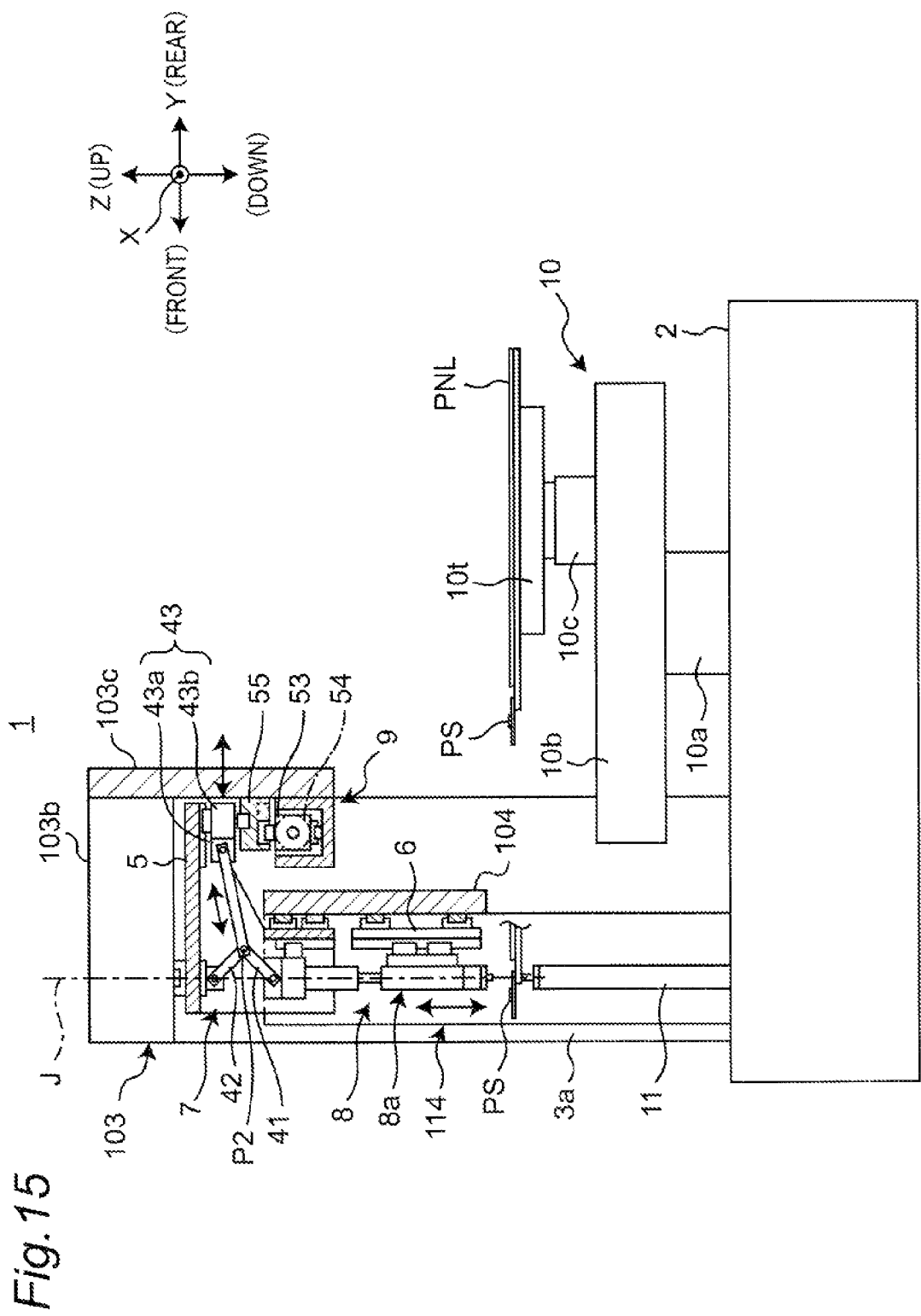
FIG. 15 is a side sectional view of the component press bonding apparatus in accordance with the modification of the embodiment of the invention.

In such a double frame structure, as shown in a side sectional view of the press bonding apparatus of FIG. 15, the plurality of press bonding heads 8 are supported by the inner frame 114 so as to be movable upward and downward, and the link mechanisms 7, the link brackets 5, and the press bonding head driving unit 9 are supported by the outer frame 103. Specifically, the plurality of press bonding heads 8 are supported by a beam member 104, fixed to rear side of the inner frame 114 with respect to the Y axis direction, so as to be movable upward and downward. The outer frame 103 is composed of vertical members 103a, a horizontal member 103b, and a beam member 103c. The link mechanisms 7 are supported by the horizontal member 103b through the plurality of link brackets 5 so as to be movable in the X axis directions and the press bonding head driving unit 9 is supported by the beam member 103c.

With employment of such a double frame structure, great majority of forces (reaction forces) caused by the actuation of moving up and down the plurality of press bonding heads 8 can be received by the outer frame 103, so that the forces acting on the inner frame 114 that supports the plurality of press bonding heads 8 so that the heads are movable upward and downward can be reduced. Thus influence the press bonding operation by the press bonding heads 8 exerts on positional accuracy (e.g., positional accuracy in the X axis direction, the Y axis direction and the like) of the plurality of press bonding heads 8 can be reduced, and press bonding of components with high positional accuracy can be attained.

It is to be noted that, by properly combining the arbitrary embodiments of the aforementioned various embodiments, the effects possessed by them can be produced.

The invention provides the component press bonding apparatus in which compacting of the overall apparatus and improvement in productivity can be attained by reduction in size of the press bonding head driving unit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of specification, drawings, and claims of Japanese patent application No. 2009-182994 filed on Aug. 6, 2009 is incorporated herein by reference in its entirety.

The invention claimed is:

1. A component press bonding apparatus for press bonding components onto a substrate by bringing a plurality of press bonding heads from above into contact with side edge parts of the substrate having undergone positioning by a substrate positioning unit holding the substrate, the component press bonding apparatus comprising:

a frame which supports the plurality of press bonding heads so that the press bonding heads are movable upward and downward, the press bonding heads being arranged side by side, a plurality of link mechanisms which respectively move up and down the press bonding heads, the link mechanisms being provided corresponding to the press bonding heads, and a press bonding head driving unit which collectively actuates the link mechanisms thereby collectively moving the press bonding heads upward and downward, wherein the link mechanisms each comprising:

a first link member having one end pivotably connected to an upper end of the press bonding head, a second link member having one end pivotably connected to the other end of the first link member and having the other end pivotably connected to the frame above the press bonding head, and a connection slide part connected to a connection part between the first and second link members, wherein the frame comprises:

a first frame which supports the press bonding heads so that the press bonding heads are movable upward and downward, and a second frame configured separately from the first frame, the second frame supporting the press bonding head driving unit and pivotably supporting the other ends of the second link members, the press bonding head driving unit comprises:

a first slider which is reciprocated in a direction of the side-by-side arrangement of the press bonding heads, and a second slider connected to the connection slide parts of the link mechanisms, the second slider being driven by the first slider through a cam mechanism so as to move the connection slide parts in a direction orthogonal to the direction of the side-by-side arrangement, wherein the press bonding head driving unit drives the first slider reciprocately in the direction of the side-by-side arrangement, thereby driving the connection slide parts of the link mechanisms in the direction orthogonal to the direction of the side-by-side arrangement, thereby opening and closing the first and second link members in the vertical direction, thereby collectively moving the press bonding heads downward and upward.

2. The component press bonding apparatus according to claim 1, wherein the press bonding heads are supported by the frame so as to be independently movable in the direction of the side-by-side arrangement, wherein the link mechanisms are supported by the frame so as to be independently movable in the direction of the side-by-side arrangement, and the second slider comprises a connection groove which is formed so as to extend in the direction of the side-by-side arrangement and to which the connection slide parts are connected so as to be movable in the direction of the side-by-side arrangement.

3. The component press bonding apparatus according to claim 1, wherein the cam mechanism of the press bonding head driving unit is a groove cam mechanism having a groove inclined with respect to the direction of the side-by-side arrangement.

4. A component press bonding method for press bonding components onto a substrate by bringing a plurality of press bonding heads, arranged side by side so as to be movable upward and downward and supported by a frame so as to be movable in a direction of the side-by-side arrangement of the press bonding heads, into contact with components placed on the side edge parts of the substrate from above, the component press bonding method comprising:

moving a first slider in a first direction along the direction of the side-by-side arrangement, thereby driving respective connection slide parts in a horizontal direction orthogonal to the direction of the side-by-side arrangement through a cam mechanism and a second slider with respect to a plurality of link mechanisms that each have a first link member having one end pivotably connected to an upper end of a press bonding head, a second link member having one end pivotably connected to the other end of the first link member and having the other end pivotably supported by the frame above the press bonding head, and the connection slide part connected to a connection part between the first and second link members and that are provided corresponding to the press bonding heads and supported by the frame so as to be movable in the direction of the side-by-side arrangement, where driving the respective connection slide parts moves the first and second link members so that the first and second link members are opened in a vertical direction, thereby moving down the press bonding heads, press bonding the components placed on the side edge parts of the substrate by the press bonding heads, and thereafter driving the first slider in a direction opposite to the first direction along the direction of the side-by-side arrangement, driving the connection slide parts in the horizontal direction through the cam mechanism and the second slider, thereby moving the first and second link members so that the first and second link members are closed in the vertical direction, thereby moving up the press bonding heads.

* * * * *